(12) United States Patent
Hoelen et al.

(10) Patent No.: US 7,658,528 B2
(45) Date of Patent: Feb. 9, 2010

(54) ILLUMINATION SYSTEM

(75) Inventors: Christoph Gerard August Hoelen, Eindhoven (NL); Johannes Petrus Maria Ansems, Eindhoven (NL); Stein Kuiper, Eindhoven (NL)

(73) Assignee: Koninklijke Philips Electronics, N.V., Eindhoven (NL)

( * ) Notice: Subject to any disclaimer, the term of this patent is extended or adjusted under 35 U.S.C. 154(b) by 443 days.

(21) Appl. No.: 11/721,096

(22) PCT Filed: Dec. 2, 2005

(86) PCT No.: PCT/IB2005/054012

§ 371 (c)(1),
(2), (4) Date: Jun. 7, 2007

(87) PCT Pub. No.: WO2006/061752

PCT Pub. Date: Jun. 15, 2006

(65) Prior Publication Data

US 2009/0262536 A1     Oct. 22, 2009

(30) Foreign Application Priority Data

Dec. 9, 2004   (EP) ............................ 04106435

(51) Int. Cl.
*F21V 9/00* (2006.01)
*G02B 1/06* (2006.01)

(52) U.S. Cl. .................. 362/555; 362/558; 362/318; 359/665

(58) Field of Classification Search .......... 362/555, 362/558, 318, 278, 552; 359/665, 666
See application file for complete search history.

(56) References Cited

U.S. PATENT DOCUMENTS

| 5,345,337 | A | * | 9/1994 | Sigler | 359/665 |
| 5,348,486 | A | * | 9/1994 | Tura et al. | 439/125 |
| 6,288,846 | B1 | * | 9/2001 | Stoner, Jr. | 359/666 |
| 6,473,543 | B2 | * | 10/2002 | Bartels | 385/16 |
| 7,230,771 | B2 | * | 6/2007 | Kuiper et al. | 359/665 |

* cited by examiner

*Primary Examiner*—Stephen F Husar
*Assistant Examiner*—Peggy A. Neils

(57) ABSTRACT

An illumination system has a plurality of light emitters (R5G5B), a first light-collimator (1) for collimating light emitted by the light emitters, and at least a second light-collimator (2) for collimating light emitted by the light emitters. The first light-collimator is arranged around a longitudinal axis (25) of the illumination system, and second light-collimator is being arranged around the first light-collimator along the longitudinal axis. Light propagation in the first light-collimator on total internal reflection. Light propagation in the second light-collimator is based on total internal reflection or on reflection at an outer surface of the second light-collimator facing away from the longitudinal axis. The cavity (3) is provided between the first and the second light-collimator. The cavity is provided with a switchable element based on electrowetting, wherein the switchable optical element is switchable in a mode of operation reducing the effect of the second light-collimator.

11 Claims, 8 Drawing Sheets

ILLUMINATION SYSTEM

The invention relates to an illumination system comprising a plurality of light emitters and at least a first light-collimator for collimating light emitted by the light emitters.

Such illumination systems are known per se. They are used, inter alia, for general lighting purposes, such as spot lights, accent lighting, flood lights and for large-area direct-view light emitting panels such as applied, for instance, in signage, contour lighting, and billboards. In other applications, the light emitted by such illumination systems is fed into a light guide, optical fiber or other beam-shaping optics. In addition, such illumination systems are used as backlighting of (image) display devices, for example for television receivers and monitors. Such illumination systems can be used as a backlight for non-emissive displays, such as liquid crystal display devices, also referred to as LCD panels, which are used in (portable) computers or (cordless) telephones. Another application area of the illumination system according to the invention is the use as illumination source in a digital projector or so-called beamer for projecting images or displaying a television program, a film, a video program or a DVD, or the like.

Generally, such illumination systems comprise a multiplicity of light sources, for instance light-emitting diodes (LEDs). LEDs can be light sources of distinct primary colors, such as, for example the well-known red (R), green (G), or blue (B) light emitters. In addition, the light emitter can have, for example, amber or cyan as primary color. These primary colors may be either generated directly by the light-emitting-diode chip, or may be generated by a phosphor upon irradiance with light from the light-emitting-diode chip. In the latter case, also mixed colors or white light is possible as one of the primary colors. Generally, the light emitted by the light sources is mixed in the light-collimator for obtaining a uniform distribution of the light while eliminating the correlation of the light emitted by the illumination system to a specific light source. In addition, it is known to employ a controller with a sensor and some feedback algorithm in order to obtain high color accuracy.

U.S. Patent Application US-A 2003/0 076 034 discloses a LED chip package including a base, an array of LED chips disposed on the base, and a collimator mounted on the base, over the array of light-emitting-diode chips. The LED chips of the array are typically arranged in an in-line manner. The collimator is generally configured as a rectangular, horn-like member and typically includes a first set of walls that collimate the light emitted by the LED chips in a first direction and a second set of walls that minimally collimate the light emitted by the LED chips in a second direction.

A drawback of the known illumination system is that the beam pattern emitted by the illumination system cannot be changed.

The invention has for its object to eliminate the above disadvantage wholly or partly. According to the invention, this object is achieved by an illumination system comprising:

a plurality of light emitters, a first light-collimator for collimating light emitted by the light emitters, the first light-collimator being arranged around a longitudinal axis of the illumination system, light propagation in the first light-collimator being based on total internal reflection, at least a second light-collimator for collimating light emitted by the light emitters, the second light-collimator being arranged around the first light-collimator along the longitudinal axis, light propagation in the second light-collimator being based on total internal reflection or on reflection at an outer surface of the second light-collimator facing away from the longitudinal axis, a cavity being provided between the first and the second light-collimator, the cavity being provided with a switchable optical element based on electrowetting, the switchable optical element being switchable in a mode of operation reducing the effect of the second light-collimator.

A light beam emitted by the light emitters travels through the first light-collimator. If on the one hand, there is no change in refractive index in passing from the first and the second light-collimator, light will not be reflected at the interface between the first and the second light-collimator. The light travels from the first light-collimator through the switchable optical element and enters the second light-collimator. In this mode of operation the combination of the first light-collimator, the switchable optical element and the second light-collimator operate as a single light-collimator based on total internal reflection or on reflection at an outer surface of the second light-collimator facing away from the longitudinal axis. Depending on the shape of the second light-collimator this will generally result in a relatively narrow light beam emitted by the illumination system.

If on the other hand, there is a change in refractive index at the interface between the first light-collimator and the switchable optical element, light will be reflected at the interface between the first light-collimator and the switchable optical element. In this mode of operation only the first light-collimator contributes to the beam shaping of the light beam emitted by the illumination system. Depending on the shape of the first light-collimator this will generally result in a relatively narrow light beam emitted by the illumination system.

In general there are at least two interfaces between the first and the second light-collimator. There is a first interface between the first light-collimator to a fluid in the switchable optical element provided in the cavity and the first light-collimator and a second interface between the fluid in the switchable optical element provided in the cavity and the second light-collimators. If at both interfaces there is no change in refraction, then there is no light reflection at these interfaces. If there is a relatively small change in refraction index, some light will be reflected, but this still may be acceptable to obtain a beam-width switchable system.

By switching the switchable optical element between the two modes of operation, the effect of the second light-collimator can be influenced and the shape of the beam can be modified from a relatively broad beam when predominantly the first light-collimator determines the beam shaping into a relatively broad beam when predominantly the second light-collimator determines the beam shaping. In this latter mode of operation, the first and the second light-collimator act together.

The optical effect of the switchable optical element is caused by a change in refractive index at the interface of the first light-collimator and the switchable optical element. The switchable optical element is based on electrowetting. Electrowetting is the phenomenon whereby an electric field modifies the wetting behavior of a polar fluid in contact with a hydrophobic insulated electrode and possibly in direct electrical contact with a second electrode. If an electric field is applied by applying a voltage between the electrodes a surface energy gradient is created which can be used to manipulate the polar fluid to move towards the insulated electrode.

Generally speaking, in a switchable optical element a first fluid is replaced by a second fluid. A switchable optical element based on electrowetting allows fluids to be independently manipulated under direct electrical control without the use of pumps, valves or even fixed channels.

When the switchable optical element is switched to the mode of operation in which the effect of the second light-collimator is reduced, the switchable optical element introduces a fluid at the interface of the first light-collimator and the switchable optical element to enhance the change in refractive index at the interface of the first light-collimator and the switchable optical element, wherein the influence of the second light-collimator is reduced.

By enhancing the change in refractive index at the interface of the first light-collimator and the switchable optical element, broadening of the angular distribution of the light emitted by the illumination system is stimulated. When the switchable optical element is not in the mode of operation in which the effect of the second light-collimator is reduced, the angular distribution of the light emitted by the illumination system becomes narrower. The width of the light beam emitted by the illumination system can be varied by changing the difference in refractive indices between the first light-collimator and the switchable optical element.

The measure according to the invention allows the angular distribution of the light beam emitted by the illumination system to be influenced by suitably switching the switchable optical element to influence the difference between the refractive index of the first light-collimator and the refractive index of the switchable optical element. In principle, either by applying segmentation in the switchable optical element and by independent addressing of these segments or by sufficiently fast sequential operation of the system in the two modes, it is possible to switch between various angles of the light beam emitted by the illumination system. By suitably adapting the difference between the refractive index of the first light-collimator and the switchable optical element, the shape of a light beam emitted by the illumination system can be changed from, for instance, a "spot" light beam with a relatively narrow angular distribution to a "flood" light beam with a relatively broad angular distribution. A further advantage of the illumination system according to the invention is that the shape of the light beam and/or the beam pattern of the illumination system can be adjusted dynamically.

By basing the propagation of light emitted by the light emitters on total internal reflection (TIR), light losses in the first and second light-collimator are largely avoided. Preferably, the first and second light-collimator are made of a non-gaseous, optically transparent dielectric material with a refractive index larger than or equal to 1.3. Preferably, the refractive indices of the first and the second light-collimator are substantially the same. Preferably, a portion of the second light-collimator not being contiguous with the switchable optical element is provided with a reflective coating on a surface facing the longitudinal axis.

A preferred embodiment of the illumination system according to the invention is characterized in that the switchable optical element is switchable in a mode of operation wherein the effect of the second light-collimator is substantially absent. In this mode of operation situation the second light-collimator does not contribute to the shaping of the light beam emitted by the illumination system. The switchable optical element counteracts the participation of the second light-collimator to the beam shaping of the light beam emitted by the illumination system.

An optical element based on electrowetting can be realized in various manners. A preferred embodiment of the illumination system according to the invention is characterized in that wherein the cavity is provided with means enabling exchange of a first fluid by a second fluid in the cavity when the switchable optical element switches to the mode of operation reducing the effect of the second light-collimator. When the second fluid is in the cavity of the switchable optical element the change in refractive index at the interface of the first light-collimator and the switchable optical element is reduced whereby the narrowing of the angular distribution of the light emitted by the illumination system is stimulated. The means enabling exchange of the first fluid by the second fluid in the cavity encompass a configuration of electrowetting electrodes controlled by a voltage control system and a suitable insulating layer in the cavity. In addition, a hydrophobic fluid contact layer may be formed between the fluid insulation layer and the fluids.

A manner to stimulate the exchange of fluids in the cavity based on electrowetting is to give the fluids different electrical properties. To this end a preferred embodiment of the illumination system according to the invention is characterized in that the first fluid is electrically insulative and the second fluid is electrically conductive. In general, the second fluid is electrically susceptible, for instance conductive, polar or polarisable. A suitable combination is a first fluid comprising an oil-based electrically insulative fluid, for example silicone oil and a second fluid comprising an aqueous electrically conductive fluid, for example salted water having a predetermined refractive index.

Preferably, the first fluid is air and the second fluid is a polar liquid. Air is an electrically insulative fluid. A suitable example of a polar liquid is an aqueous electrically conductive fluid, for example salted water having a predetermined refractive index.

It may be desirable to further stimulate light mixing in the illumination system or to further shape the light beam. To this end a preferred embodiment of the illumination system according to the invention is characterized in that the illumination system further comprises a further light-collimator for collimating light emitted by the light emitters, the further light-collimator being arranged around the second light-collimator along the longitudinal axis, in that a further cavity is provided between the second and the further light-collimator, in that the further cavity is provided with a further switchable optical element based on electrowetting, and in that the further switchable optical element is switchable in a mode of operation reducing the effect of the further light-collimator.

Preferably, the further cavity is provided with means enabling exchange of a first fluid by a second fluid in the further cavity when the further switchable optical element switches to the mode of operation reducing the effect of the further light-collimator. Preferably, the first fluid is electrically insulative and the second fluid is electrically conductive. Preferably, the first fluid is air or oil and the second fluid is a polar liquid.

These and other aspects of the invention are apparent from and will be elucidated with reference to the embodiments described hereinafter.

In the drawings.

The Figures are purely diagrammatic and not drawn to scale. Notably, some dimensions are shown in a strongly exaggerated form for the sake of clarity. Similar components in the Figures are denoted as much as possible by the same reference numerals.

Figure 1A:
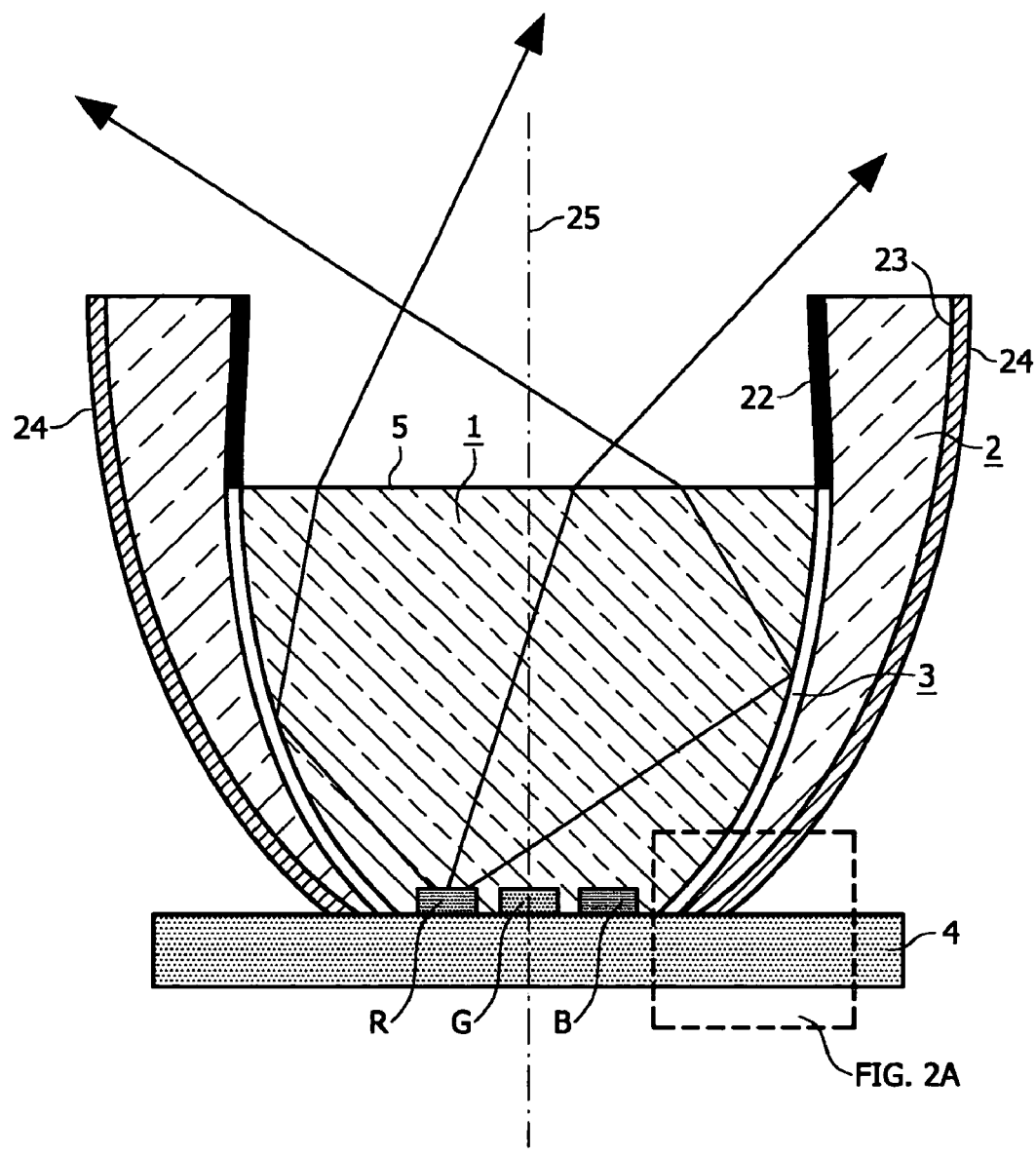
FIG. 1A is a cross-sectional view of a first embodiment of the illumination system according to the invention with a first and a second light-collimator.
Figure 1B:
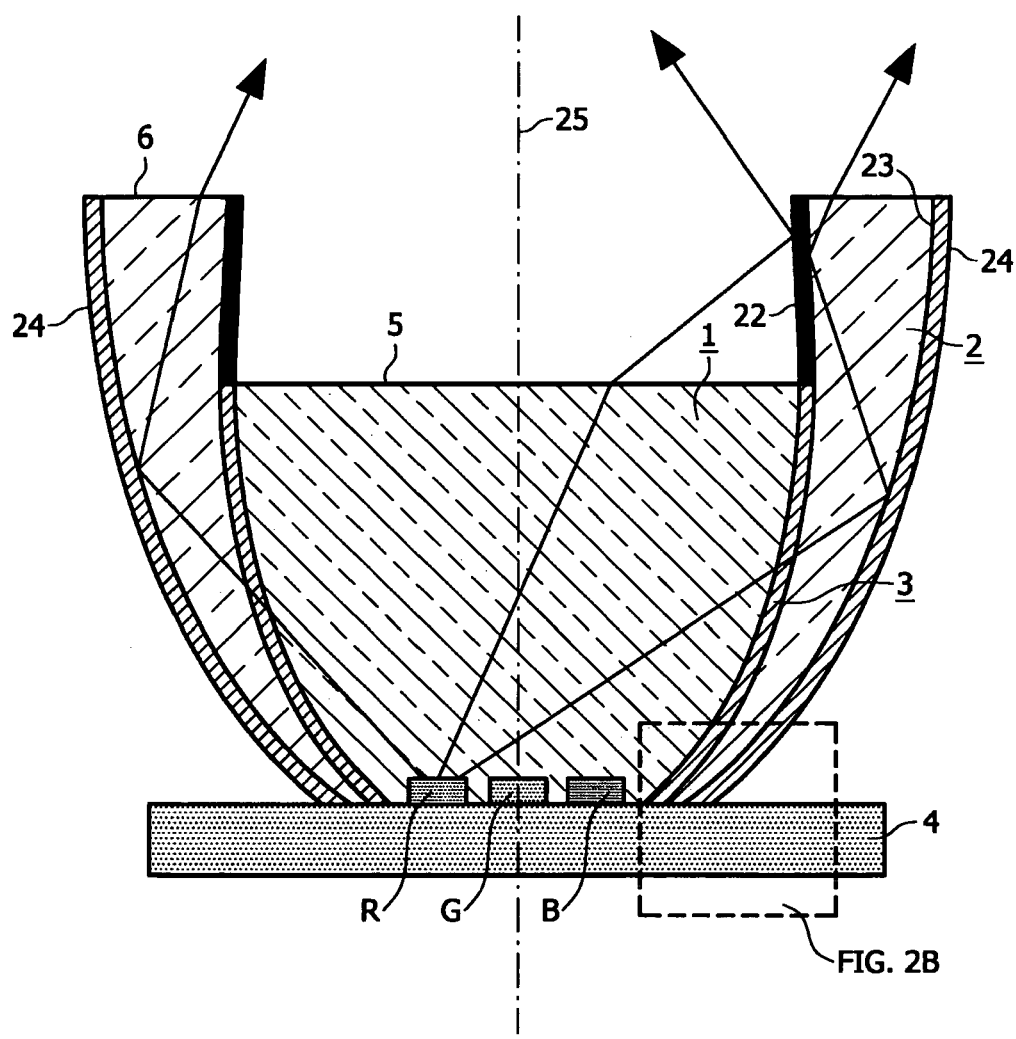
FIG. 1B is the embodiment of the illumination system shown in FIG. 1A in another mode of operation.

FIG. 1A schematically shows a cross-sectional view of a first embodiment of the illumination system according to the invention. FIG. 1B schematically shows a cross-sectional view of the embodiment of the illumination system shown in FIG. 1A in the mode of operation where the effect of the second light-collimator is enhanced.

The illumination system in FIGS. 1A and 1B comprises a plurality of light sources, for instance a plurality of light-emitting diodes (LEDs). LEDs can be light sources of distinct primary colors, such as in the example of FIGS. 1A and 1B, the well-known red R, green G, or blue B light emitters. Alternatively, the light emitter can have, for example, amber or cyan as primary color. The primary colors may be either generated directly by the light-emitting-diode chip, or may be generated by a phosphor upon irradiance with light from the light-emitting-diode chip. In the latter case, also mixed colors or white light can act as one of the primary colors of the illumination system. In the example of FIGS. 1A and 1B, the LEDs R, G, B are mounted on a (metal-core) printed circuit board 4. In general, the LEDs have a relatively high source brightness. Preferably, each of the LEDs has a radiant power output of at least 25 mW when driven at nominal power. LEDs having such a high output are also referred to as LED power packages. The use of such high-efficiency, high-output LEDs has the specific advantage that, at a desired, comparatively high light output, the number of LEDs may be comparatively small. This has a positive effect on the compactness and the efficiency of the illumination system to be manufactured. If LED power packages are mounted on such a (metal-core) printed circuit board 4, the heat generated by the LEDs can be readily dissipated by heat conduction via the PCB. In a favorable embodiment of the illumination system, the (metal-core) printed circuit board 4 is in contact with the housing (not shown in FIGS. 1A and 1B) of the illumination system via a heat-conducting connection. Preferably, so-called naked-power LED chips are mounted on a substrate, such as for instance an insulated metal substrate, a silicon substrate, a ceramic or a composite substrate. The substrate provides electrical connection to the chip and acts as well as a good heat transfer to a heat exchanger.

The embodiment of the illumination system as shown in FIGS. 1A and 1B comprises a first light-collimator 1 for collimating light emitted by the light emitters R, G, B. The first light-collimator 1 is arranged around a longitudinal axis 25 of the illumination system Light propagation in the first light-collimator 1 is substantially based on total internal reflection when the switchable optical element is in a mode of operation wherein the influence of the second light-collimator is reduced. Light is emitted from the illumination system at a light-exit window 5 of the first light-collimator 1 at a side facing away from the light-emitters R, G, B. In the embodiment of FIGS. 1A and 1B, a second light-collimator 2 for collimating light emitted by the light emitters R, G, B is arranged around the first light-collimator 1 along the longitudinal axis 25. Light propagation in the second light-collimator 2 is based on total internal reflection or on reflection at an outer surface 23 of the second light-collimator 2 facing away from the longitudinal axis 25. In the example of FIGS. 1A and 1B the outer surface 23 of the second light-collimator 2 has been provided with a reflective coating 24.

In between the first and the second light-collimator 1; 2 a cavity 3 is provided. The cavity 3 is provided with a switchable optical element based on electrowetting (see FIGS. 2A, 2B, 3A and 3B for details about the switchable optical element). In the situation as shown in FIG. 1A the switchable optical element is switched in a mode of operation wherein the effect of the second light-collimator 2 is reduced; in this mode of operation the second light-collimator 2 does not substantially contribute to the formation of the light beam emitted by the illumination system. In an alternative configuration, the broad beam is a superposition of a central part that is created by the second light-collimator and a broader part that is created by the first light-collimator. By switching to the so-called narrow-beam mode, the complete beam is (predominantly) determined by the second light-collimator.

In the situation as shown in FIG. 1B the switchable optical element in the cavity 3 is switched in a mode of operation wherein the second light-collimator 2 contributes to formation of the light beam emitted by the illumination system and predominantly determines the shape or width of the light beam. In this mode of operation light is emitted from the illumination system at the light-exit window 5 of the first light-collimator 1 as well as at a light-exit window 6 of the second light-collimator 2.

The switchable optical element provided in the cavity 3 is capable of creating a step in refractive index between the first and the second light-collimator. If the switchable optical element is switched to a mode of operation wherein there is a substantial change in refractive index at the interface between the first light-collimator 1 and the fluid in the cavity 3, light emitted by the light-emitters R, G, B and propagating in the first light-collimator 1 being reflected at the interface between the first light-collimator 1 and the fluid in the cavity 3. This mode of operation is exemplified in FIG. 1A. In FIG. 1A, light propagating in the first light-collimator 1 will be reflected at the interface between the first light-collimator and the switchable optical element in the cavity 3 and will not enter the second light-collimator 2. In this mode of operation the second light-collimator 2 does not contribute the formation of the light beam emitted by the illumination system. Depending on the shape of the first light-collimator 1 this will generally result in a relatively broad light beam emitted by the illumination system.

In an alternative embodiment part of the light is reflected at the interface between the first light-collimator 1 and the fluid in the cavity 3, and part of the light is transmitted into the second light-collimator 2, with the overall effect of a relatively broad beam emitted by the illumination system.

If the switchable optical element is switched to a mode of operation wherein there is no or a relative small change in refractive index at the interface between the first light-collimator 1 and the fluid in the cavity 3, light emitted by the light-emitters R, G, B and propagating in the first light-collimator 1 will not or not predominantly be reflected at the interface between the first light-collimator 1 and the fluid in the cavity 3. This mode of operation is exemplified in FIG. 1B. In FIG. 1B, light travels from the first light-collimator 1 through the switchable optical element in the cavity 3 and enters the second light-collimator 2. In this mode of operation the first light-collimator 1 and the second light-collimator 2 operate as a single light-collimator based on total internal reflection or on reflection at the reflective coating 24 provided on the outside surface 23 of the second light-collimator 2. Depending on the shape of the second light-collimator 2 this will generally result in a relatively narrow light beam emitted by the illumination system.

By switching the switchable optical element in the cavity 3 between the two modes of operation, the effect of the second light-collimator 2 can be influenced and the shape of the beam can be modified from a relatively broad beam when the first light-collimator 1 determines the beam shaping into a relatively narrow beam when the first light-collimator 1 and the second light-collimator 2 determine the shape of the light beam.

In the embodiment of the illumination system as shown in FIGS. 1A and 1B a portion of the second light-collimator 2 facing the longitudinal axis 25 and not being contiguous with the switchable optical element in the cavity 3 is provided with a reflective coating 22. To exemplify the effects a number of light rays has been drawn in FIGS. 1A and 1B.

Figure 2A:
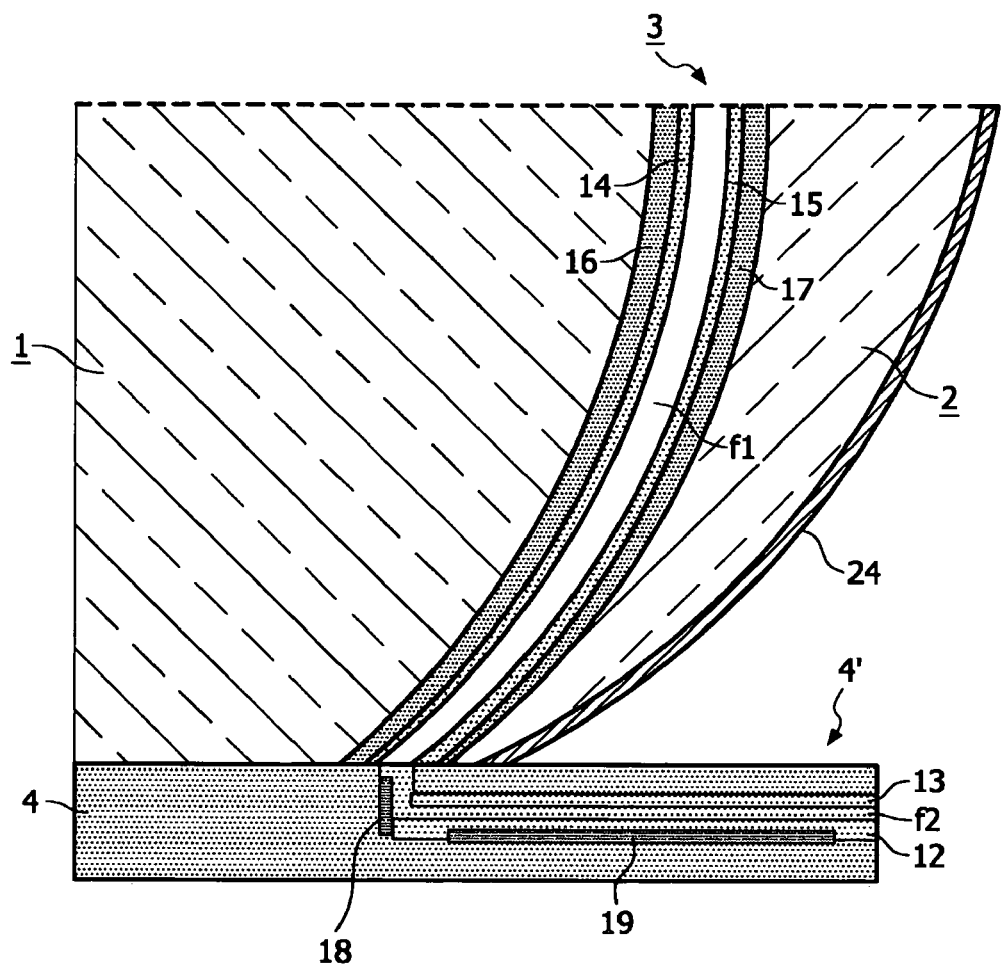
FIG. 2A is a cross-sectional view of an embodiment of the switchable optical element in a first mode of operation of the first embodiment of the illumination system as shown in FIG. 1A.

FIG. 2A schematically shows a cross-sectional view of an embodiment of the switchable optical element in a first mode of operation of the first embodiment of the illumination system as shown in FIG. 1A. In addition, FIG. 2B schematically shows a cross-sectional view of the embodiment of the switchable optical element as shown in FIG. 2A in a second mode of operation of the first embodiment of the illumination system as shown in FIG. 1B.

Figure 2B:
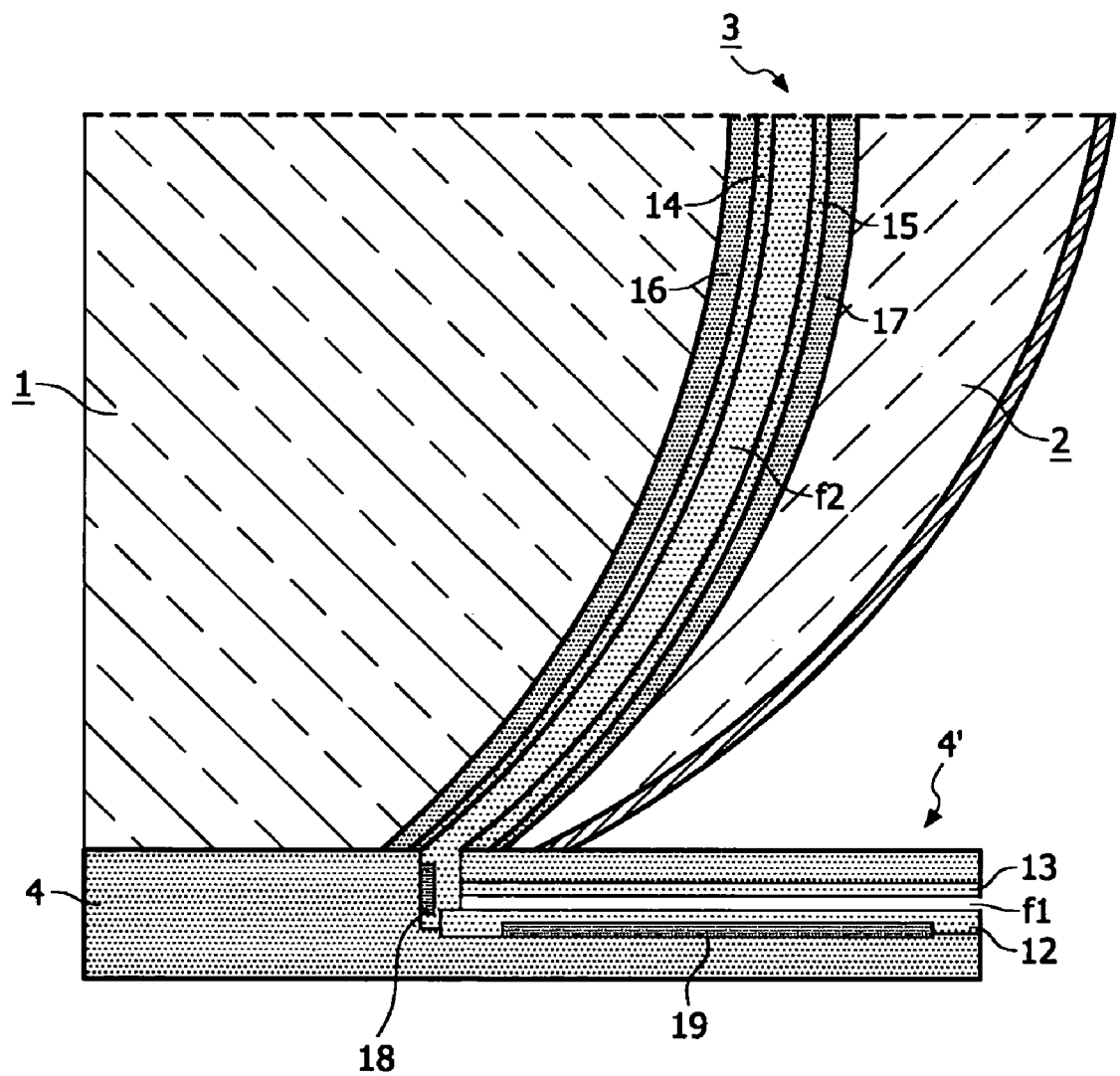
FIG. 2B is a cross-sectional view of the embodiment of the switchable optical element as shown in FIG. 2A in a second mode of operation of the first embodiment of the illumination system as shown in FIG. 1B.

The switchable optical element in the cavity 3 in FIGS. 2A and 2B is based on electrowetting. Electrowetting is the phenomenon whereby an electric field modifies the wetting behavior of an electrically susceptible fluid in contact with a partially wetted (i.e. a contact angle larger than 0° in absence of a voltage) insulated electrode and in direct electrical contact with, or capacitively coupled to, a second electrode. If an electric field is applied by applying a voltage between the electrodes a surface energy gradient is created which can be used to manipulate a polar fluid to move towards the insulated electrode or to replace a first by a second fluid. A switchable optical element based on electrowetting allows fluids to be independently manipulated under direct electrical control without the use of pumps, valves or even fixed channels.

The switchable optical element in the cavity 3 based on electrowetting as shown in FIGS. 2A and 2B comprises first transparent electrodes 16, 17 adjacent the first and second light-collimator 1, 2, respectively. In addition, a second electrode 18 and a third electrode 19 are provided in a further cavity 4' in the printed circuit board 4 in the printed circuit board 4 of the illumination system. The first electrodes 16, 17 are covered by an insulating hydrophobic coating 14, 15, respectively. In addition, the third electrode 19 is covered by an insulating hydrophobic coating 12. The remainder of further cavity 4' in the printed circuit board 4 is coated with a hydrophobic layer 13. Preferably, the first transparent electrodes 16,17 comprise indium tin oxide (ITO). Preferably, the insulating hydrophobic coatings 12, 14, 15 comprise Teflon™ AF1600 produced by DuPont™, or a stack of parylene and AF-1600. Preferably, the hydrophobic layer 13 comprises AF-1600.

In the mode of operation as shown in FIG. 2A, a first fluid $f_1$ is present in the cavity 3 while the second fluid $f_2$ is present in the further cavity 4' in the printed circuit board 4. In the other mode of operation as shown in FIG. 2B, the second fluid $f_2$ is present in the cavity 3 while the first fluid $f_1$ is present in the further cavity 4' in the printed circuit board 4. Switching between the modes of operation of the switchable optical element is achieved by changing the voltage applied to the various electrodes. In one mode of operation a voltage is applied between the second electrode 18 and the counter electrode 19 (see FIG. 2A), in which case the first fluid $f_1$, in this case an insulative fluid, is present in the cavity 3 while the second fluid $f_2$ is present in the cavity 3'. If now the voltage between the second electrode 18 and the counter electrode 19 is switched off, and a voltage is applied between the first electrodes 16, 17 and the second electrode 18 (see FIG. 2B), the second fluid $f_2$, in this case an electrically conductive fluid, is attracted into the cavity 3, and the second mode of operation is created. Preferably, the first fluid $f_1$ is electrically insulative. Preferably, the first fluid $f_1$ is air. Alternatively, the first fluid $f_1$ is oil, for instance silicone oil, or an alkane, e.g. hexadecane.

Another possibility to switch between the modes of operation of the switchable optical element is achieved by applying a voltage between the third electrode and a further third electrode, the first fluid $f_1$, in this case an insulative fluid, is present in the cavity 3 and the second fluid f2 in cavity 3'. If a voltage is applied between the first electrodes 16 and 17, the second fluid $f_2$, in this case an electrically conductive fluid is present in the cavity 3. To this end a further third electrode (not shown in FIGS. 2A and 2B) is introduced in the further cavity 4' facing the third electrode. In this embodiment, the electrode 18 can be dispensed with.

Figure 3A:
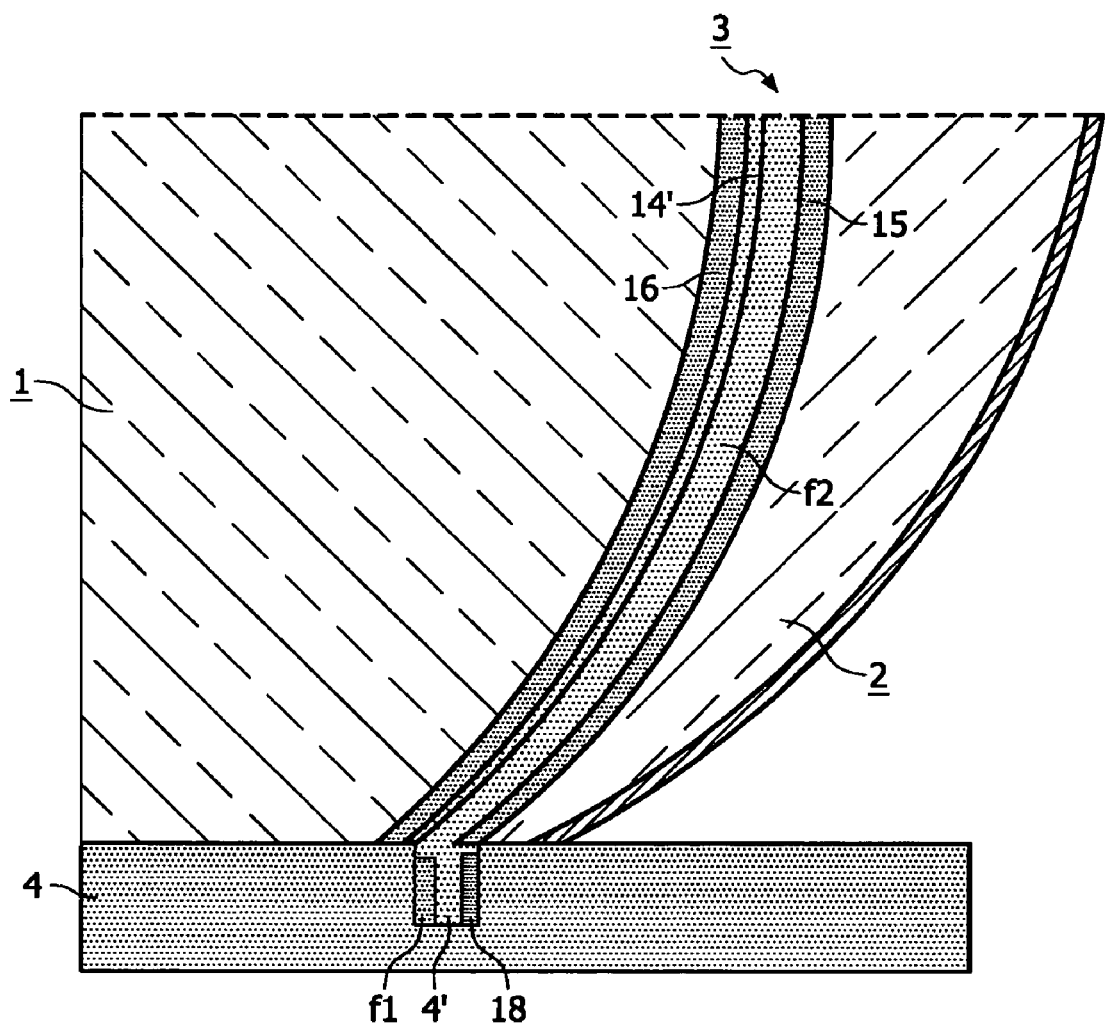
FIG. 3A is a cross-sectional view of another embodiment of the switchable optical element in a first mode of operation of the first embodiment of the illumination system as shown in FIG. 1A.

FIG. 3A schematically shows a cross-sectional view of another embodiment of the switchable optical element in a first mode of operation of the first embodiment of the illumination system as shown in FIG. 1A. In addition, FIG. 3B schematically shows a cross-sectional view of the first embodiment of the switchable optical element as shown in FIG. 3A in a second mode of operation of the first embodiment of the illumination system as shown in FIG. 1B.

Figure 3B:
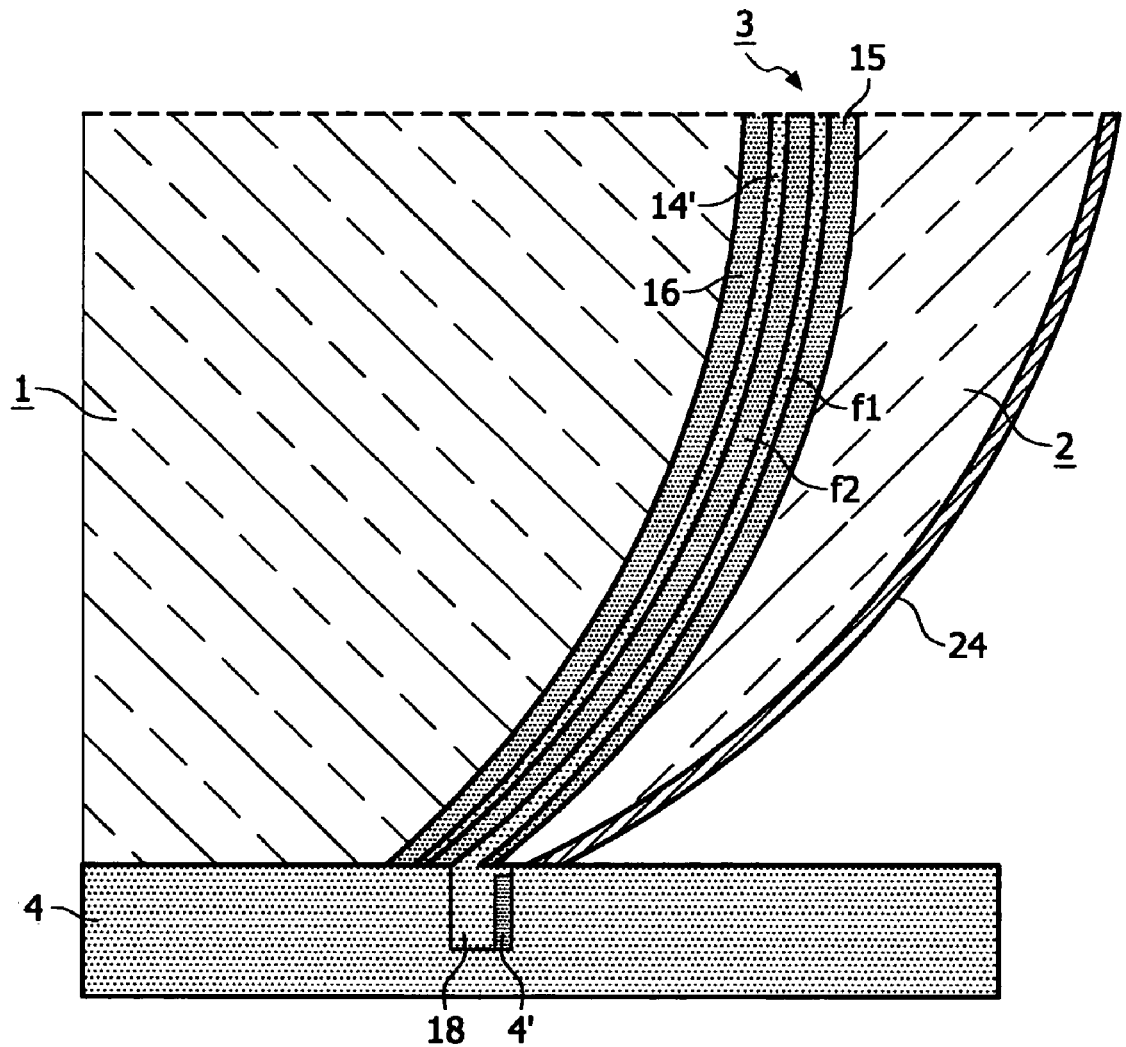
FIG. 3B is a cross-sectional view of the first embodiment of the switchable optical element as shown in FIG. 3A in a second mode of operation of the first embodiment of the illumination system as shown in FIG. 1B.

The switchable optical element in the cavity 3 based on electrowetting as shown in FIGS. 3A and 3B comprises a first transparent electrode 16 adjacent the first light-collimator 1. In addition, a second electrode 18 is provided in a further cavity 4' in the printed circuit board 4 in the printed circuit board 4 of the illumination system. The first electrode 16 is covered by an insulating hydrophobic coating 14. The wall of the cavity 3 facing the second light-collimator 2 is coated with a hydrophilic coating 14' such as silicon dioxide. This hydrophilic coating 14' can be dispensed with if the second light-collimator is made out of glass. Preferably, the first transparent electrode 16 comprises indium tin oxide (ITO). Preferably, the insulating hydrophobic coating 15 comprises AF-1600 or a stack of parylene and AF-1600.

In the mode of operation as shown in FIG. 3A, a second fluid $f_2$ is present in the cavity 3 while the first fluid $f_1$ is present in the further cavity 4' in the printed circuit board 4. In the other mode of operation as shown in FIG. 3B, both the first fluid $f_1$ and the second fluid $f_2$ are present in the cavity 3 where the second fluid is in contact with the first light-collimator 1. Switching between the modes of operation of the switchable optical element is achieved by applying a voltage between the first electrode 16 and the second electrode 18 (FIG. 3A) and not applying a voltage between the first electrode 16 and the second electrode 18 (FIG. 3B).

Preferably, the first fluid $f_1$ is electrically insulative. Preferably, the first fluid $f_1$ is oil, for instance silicone oil, or an alkane, e.g. hexadecane. Preferably, the second fluid $f_2$ is electrically conductive. A suitable example of a polar fluid is an aqueous electrically conductive fluid, for example salted water having a predetermined refractive index, e.g. potassium chloride dissolved in water.

Preferably, the contribution of the second light-collimator 2 to the light beam formation by the illumination system is substantially reduced when the switchable optical element in the cavity 3 is in the mode of operation reducing the effect of the second light-collimator 2. Preferably, the refractive index of the second fluid $f_2$ introduced in the switchable optical element is substantially the same as the refractive index $n_1$ of the first and second light-collimator 1, 2. In this case the second fluid $f_2$ acts as index-matching liquid in the cavity 3, the light passing through the switchable optical element does not experience gradients in the refractive index and accordingly does not change direction of propagation. In this situation, the second light-collimator fully contributes to the formation of the light beam emitted by the illumination system. In this situation, a relatively narrow light beam is emitted by the illumination system The effect of altering the effective refractive index of the fluid in the cavity 3 between the first and the second light-collimator 1, 2 that is in contact with the first light-collimator 1 by changing the fluid in the cavity 3, either by replacing fluid $f_1$ by fluid $f_2$ or by admitting the first fluid $f_1$ in the cavity 3 in addition to the second fluid $f_2$, is that the second light-collimator 2 no longer contributes to the formation of the light beam emitted by the illumination system. In this situation, a relatively broad light beam is emitted by the illumination system. In this manner it is possible to switch electrically between various angles of the light beam emitted by the illumination system. For instance, a "spot" light beam with an angular distribution of approximately 10° Full Width at Half Maximum (FWHM) can be converted into, for instance, a "flood" light beam with an angular distribution of approximately 30° FWHM. In principle, the change in the beam pattern can be done (quasi) continuously by sufficiently fast sequential operation of the system in the two different modes with variable relative luminous flux contributions, or by inducing partial transmission and/or reflection in addressable segments of the switchable optical element in the cavity 3.

Figure 4:
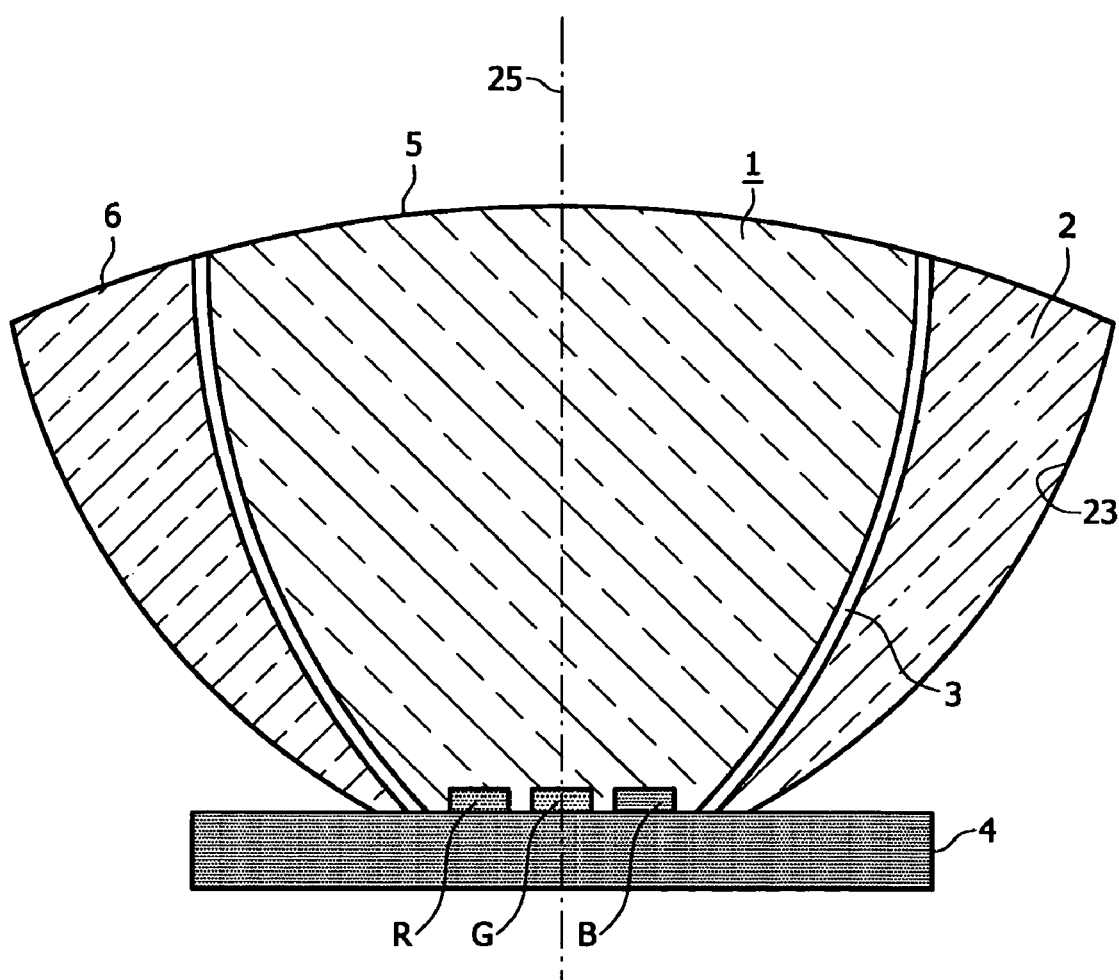
FIG. 4 is a cross-sectional view of a second embodiment of the illumination system according to the invention with a first and a second light-collimator.

FIG. 4 schematically shows a cross-sectional view of a second embodiment of the illumination system according to the invention with a first and a second light-collimator. In this configuration the light-exit window 5 and the light-exit window 6 are shaped such that, in combination with the shape of the other surfaces of the collimators, a narrow light beam is emitted by the illumination system that can be relatively smaller in dimension than in the configuration as shown in FIGS. 1A and 1B. A switchable optical element based on electrowetting is arranged in the cavity 3. In the embodiment of FIG. 4, both the first and the second light-collimator are based on total internal reflection and a reflective coating on the outer surface 23 of the second light-collimator 2 facing away from the longitudinal axis 25 is dispensed with.

FIG. 4 schematically shows a cross-sectional view of a second embodiment of the illumination system according to the invention with a first and a second light-collimator. In this configuration the light-exit window 5 and the light-exit window 6 are shaped such that a very narrow light beam is emitted by the illumination system. A switchable optical element based on electrowetting is arranged in the cavity 3.

Figure 5:
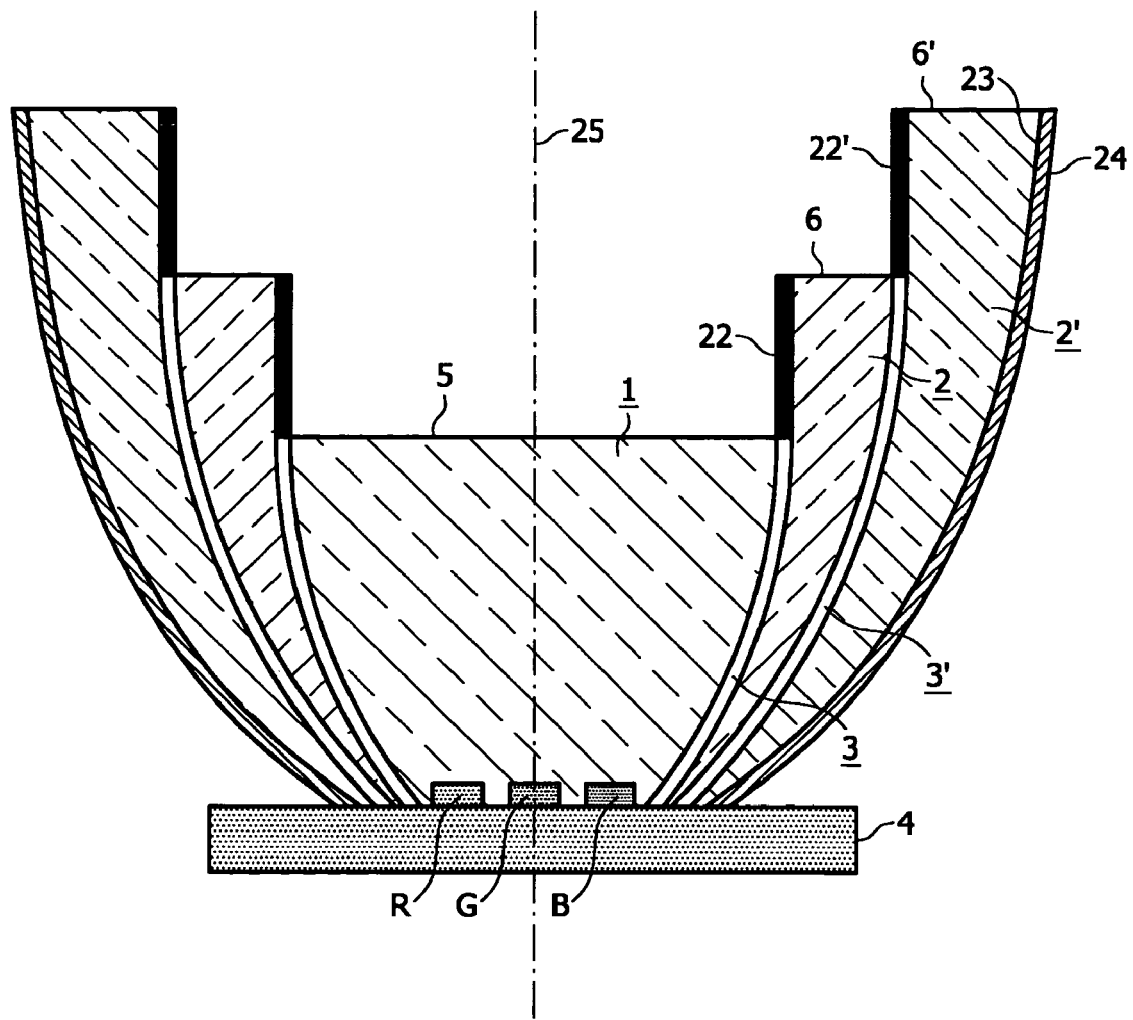
FIG. 5 is a cross-sectional view of a further embodiment of the illumination system according to the invention with a first, a second and a further light-collimator.

FIG. 5 schematically shows a cross-sectional view of a further embodiment of the illumination system according to the invention with a first light-collimator 1, a second light-collimator 2 and a further light-collimator 2'. The further light-collimator 2' is arranged around the second light-collimator 2 along the longitudinal axis 25. In the embodiment of FIG. 5 a further cavity 3' is provided between the second 2 and the further 2' light-collimator. A switchable optical element based on electrowetting is arranged in a cavity 3 adjacent the first and the second light-collimator 1, 2. In addition, the further cavity 3' is provided with a further switchable optical element based on electrowetting. The further switchable optical element is switchable in a mode of operation reducing the effect of the further light-collimator 2'. In this configuration the walls of the collimators 1 and 2 are, preferably, substantially transparent. The reflection of light in the further collimator 2' may either be based on total internal reflection or on reflection at a reflective coating 24 applied on an outer surface 23 of the further light-collimator 2'. The configuration as shown in FIG. 5 enables the creation of multiple light beam widths of the light emitted by the illumination system. If the switchable optical element in the cavity 3 is in a mode of operation that there is a step in refractive index between the first light-collimator 1 and the adjacent fluid in the cavity 3, where the refractive index of the adjacent fluid is substantially lower than the refractive index of the light-collimator 1, then the light beam emitted by the illumination system is predominantly shaped by the first light-collimator 1; a relatively broad light beam emitted by the illumination system is obtained. If the switchable optical element in the cavity 3 is in a mode of operation that there is substantially no step in refractive index between the first and the second light-collimator 1, 2, and, if the switchable optical element in the further cavity 3' is in a mode of operation that there is a step in refractive index between the second and light-collimator 2 and the adjacent fluid in the cavity 3', where the refractive index of the adjacent fluid as substantially lower than the refractive index of the light-collimator 2, then the light beam emitted by the illumination system is shaped predominantly by the second light-collimator 2, i.e. by a combined action of the first and second light-collimator 1, 2; a relatively narrow light beam emitted by the illumination system is obtained. If the switchable optical element in the cavity 3 is in a mode of operation that there is substantially no step in refractive index between the first and the second light-collimator 1, 2, and, if the switchable optical element in the further cavity 3' is in a mode of operation that there is substantially no step in refractive index between the second and the further light-collimator 2, 2', then the light beam emitted by the illumination system is substantially shaped by the further second light-collimator 2', i.e. by combined action of the first, second and further light-collimator 1, 2, 2'; a relatively very narrow light beam emitted by the illumination system can be obtained. Other beam shapes are possible as well, depending on the details of the collimator designs. In this manner it is possible to switch electrically between various angles of the light beam emitted by the illumination system. For instance, a "spot" light beam with an angular distribution of approximately 10° Full Width at Half Maximum (FWHM) can be converted into, for instance, an intermediate wide light beam with an angular distribution of approximately 20° FWHM, or a "flood" light beam with an angular distribution of approximately 30° FWHM. In principle, the change in the beam pattern can be done (quasi) continuously by sufficiently fast sequential operation of the system in the two different modes with variable relative luminous flux contributions, or by inducing light partial transmission/reflection in addressable segments of the switchable optical element in the cavity 3.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage.

The invention claimed is:

1. An illumination system comprising:
    a plurality of light emitters,
    a first light-collimator for collimating light emitted by the light emitters, the first light-collimator being arranged around a longitudinal axis of the illumination system, light propagation in the first light-collimator being based on total internal reflection,
    at least a second light-collimator for collimating light emitted by the light emitters, the second light-collimator being arranged around the first light-collimator along the longitudinal axis, light propagation in the second light-collimator being based on total internal reflection or on reflection at an outer surface of the second light-collimator facing away from the longitudinal axis, the first and the second light-collimator defining a cavity therebetween,
    a switchable optical element based on electrowetting disposed in the cavity, the switchable optical element being switchable in a mode of operation reducing the effect of the second light-collimator.

2. An illumination system as claimed in claim 1, wherein the switchable optical element is switchable in a mode of operation wherein the effect of the second light-collimator is substantially absent.

3. An illumination system as claimed in claim 1, wherein the cavity is provided with means enabling exchange of a first fluid by a second fluid in the cavity when the switchable optical element switches to the mode of operation reducing the effect of the second light-collimator.

4. An illumination system as claimed in claim 3, wherein the first fluid is electrically insulative and the second fluid ($f_2$) is electrically conductive.

5. An illumination system as claimed in claim 4, wherein the first fluid is air or oil and the second fluid is a polar liquid.

6. An illumination system as claimed in claim 1, wherein the illumination system comprises a further light-collimator for collimating light emitted by the light emitters, the further light-collimator being arranged around the second light-collimator along the longitudinal axis, in that a further cavity is provided between the second and the further light-collimator, in that the further cavity is provided with a further switchable optical element based on electrowetting, and in that the further switchable optical element is switchable in a mode of operation reducing the effect of the further light-collimator.

7. An illumination system as claimed in claim 6, wherein the further cavity is provided with means enabling exchange of a first fluid by a second fluid in the further cavity when the further switchable optical element switches to the mode of operation reducing the effect of the further light-collimator.

8. An illumination system as claimed in claim 7, wherein the first fluid is electrically insulative and the second fluid is electrically conductive.

9. An illumination system as claimed in claim 8, wherein the first fluid is air or oil and the second fluid is a polar liquid.

10. An illumination system as claimed in claim 1, wherein the illumination system comprises a plurality of light-emitting diodes of distinct primary colors or of a single primary color.

11. An illumination system as claimed in claim 10, wherein each of the light-emitting diodes has a radiant power output of at least 25 mW when driven at nominal power.

* * * * *